United States Patent [19]

Balland

[11] Patent Number: 5,224,015
[45] Date of Patent: Jun. 29, 1993

[54] HIGH ENERGY IGNITION GENERATOR IN PARTICULAR FOR A GAS TURBINE

[75] Inventor: Patrick G. A. Balland, Rueil Malmaison, France

[73] Assignee: Labo Industrie, Nanterre Cedex, France

[21] Appl. No.: 801,668

[22] Filed: Dec. 2, 1991

[30] Foreign Application Priority Data

Dec. 19, 1990 [FR] France .................. 90 15944

[51] Int. Cl.[5] ............................ H05B 41/36
[52] U.S. Cl. .................. 361/256; 361/257; 307/419
[58] Field of Search .............. 361/253–257; 307/108, 419, 107, 362, 60, 278, 282; 363/21, 97, 131; 328/66, 67

[56] References Cited

U.S. PATENT DOCUMENTS

| | | | |
|---|---|---|---|
| 3,635,202 | 1/1972 | Issler et al. | 123/148 E |
| 3,832,986 | 9/1974 | Dogadko | 123/148 E |
| 3,889,173 | 6/1975 | Klusmann et al. | 321/2 |
| 4,967,037 | 10/1990 | Roberts | 123/598 |

FOREIGN PATENT DOCUMENTS

0362014A1 4/1989 European Pat. Off. .

Primary Examiner—A. D. Pellinen
Assistant Examiner—Aditya Krishnan
Attorney, Agent, or Firm—Wenderoth, Lind & Ponack

[57] ABSTRACT

An ignition generator includes an energy source having a transformer, and a first circuit connected to a first secondary winding of the transformer. The first circuit includes a series connection of a first energy storage capacitor, an inductor and an ignition spark plug, and a free wheel diode connected in parallel to the inductor and the ignition spark plug. Circuitry is provided for shorting the first circuit to produce sparks between the electrodes of the spark plug. The generator further includes a second circuit which is electrically equivalent to the first circuit and which is connected to a second secondary winding of the transformer. The second circuit includes a second energy storage capacitor and impedance means connected in series. A comparator is provided for comparing the voltage of the second voltage energy storage capacitor with a reference voltage. Shorting of the first circuit is carried out according to an output of the comparator.

7 Claims, 1 Drawing Sheet

HIGH ENERGY IGNITION GENERATOR IN PARTICULAR FOR A GAS TURBINE

BACKGROUND OF THE INVENTION

1. Field of the Invention

The present invention relates to an improvement in a high energy ignition generator in particular used for a gas turbine.

2. Description of the Related Art

French patent Application No. 8812272, filed by the present inventor, discloses a high energy ignition generator of the type comprising a power supply provided with a transformer whose secondary winding is connected to a first circuit comprising an energy storage capacitor, an inductor and an ignition spark plug connected in series, a free wheel diode being connected in parallel to the terminals of the inductor and the ignition spark plug, and means for shorting the first circuit in such manner as to produce sparks between the electrodes of the spark plug, wherein the shorting means comprises at least one semi-conductor switching means controlled by means for comparing the voltage at the terminals of the storage capacitor with a reference value, and wherein means for controlling the charging of the capacitor at a first rate during a first period of time and at a second rate during a second period of time, the second rate being higher than the first rate, are interposed between the power supply and the first circuit.

In the embodiment disclosed in said French patent application, the means for comparing the voltage at the terminals of the energy storage capacitor of the first circuit with the reference voltage are directly connected to the terminals of this energy storage capacitor.

This results in a number of drawbacks in that it is necessary to provide a secondary power supply for these comparing means and there is no galvanic insulation between these two parts of the generator.

SUMMARY OF THE INVENTION

An object of the invention is therefore to overcome the problems of the related art by providing an ignition generator which permits galvanically insulating the two parts of the generator and which is simple and reliable.

The invention therefore provides a generator such as that described hereinbefore, characterized in that the means for comparing the voltage at the terminals and the capacitor of the first circuit with the reference voltage are connected to the terminals of the capacitor of a second circuit comprising in series at least said capacitor and impedance means connected to the terminals of another secondary winding of the transformer, the said second circuit *p816X being equivalent to first circuit so that the voltage at the terminals of the capacitor of the second circuit is the image of that at the terminals of the capacitor of the first circuit.

BRIEF DESCRIPTION OF THE DRAWING

A better understanding of the invention will be had from the following description which is given solely by way of example with reference to the accompanying drawing in which.

DETAILED DESCRIPTION OF THE PREFERRED EMBODIMENT

Figure 1:
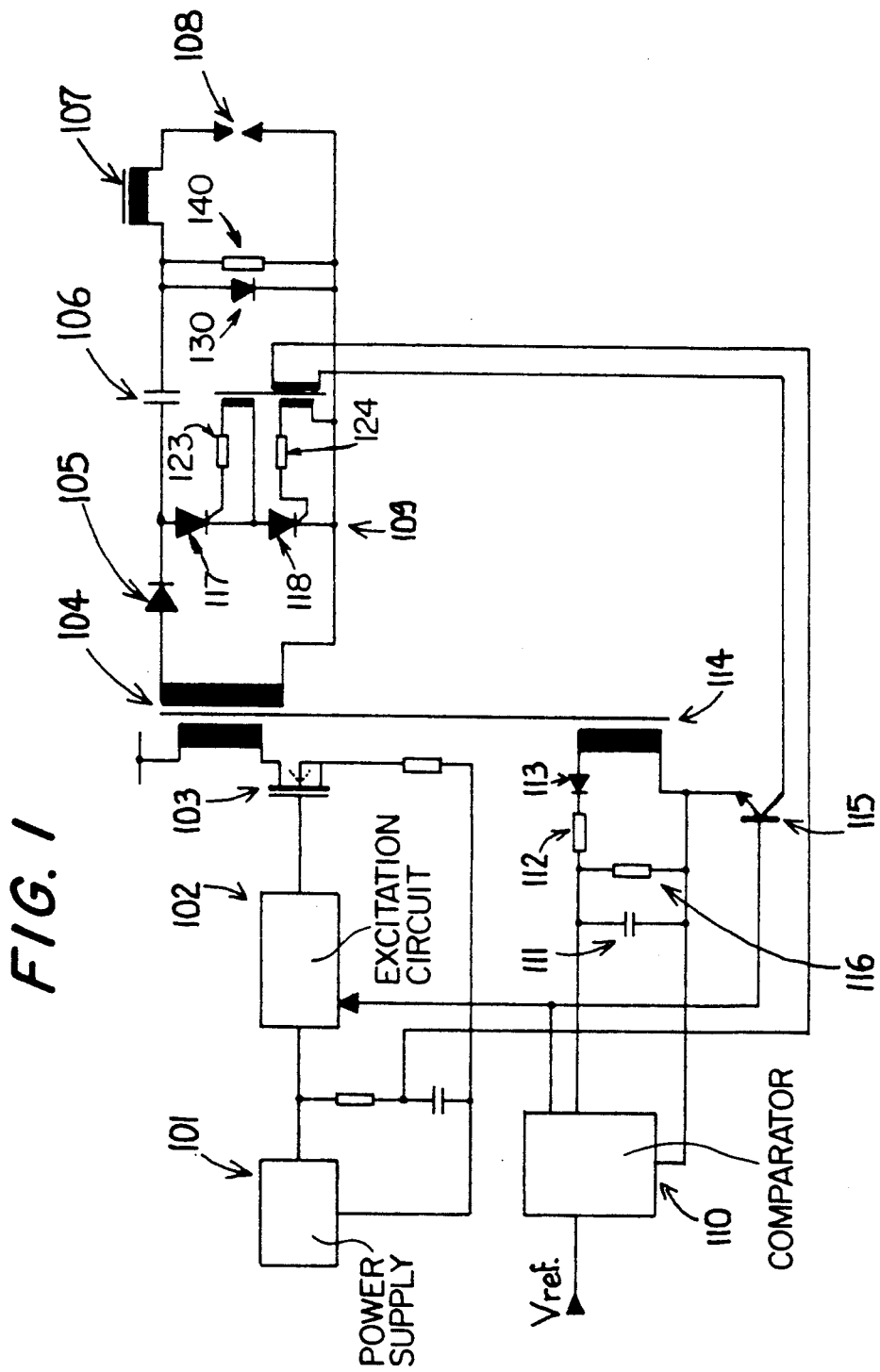
FIG. 1 represents a schematic diagram of a generator according to the invention.

The general structure of the generator diagrammed in FIG. 1 contains similarities to that disclosed in said French patent application, and accordingly, the details of said French application (which, incidently, corresponds to U.S. Pat. No. 4,983,886) are incorporated herein by reference.

The generator of FIG. 1 includes an energy source comprising a power supply 101 for triggering, through an excitation circuit 102, a transistor 103 for feeding the primary winding of a transformer 104.

A first secondary winding of this transformer is connected to a first circuit comprising in series a diode 105, an energy storage capacitor 106, an inductor 107 and an ignition spark plug 108.

Means 109 for shorting this first circuit are also provided to produce sparks between the electrodes of the spark plug.

These shorting means 109 comprise at least one semiconductor switching means formed of thyristors 117 and 118 which are controlled by means 110 for comparing the voltage at the terminals of the capacitor 106 of the first circuit with a reference voltage Vref.

Incidently, in FIG. 1, reference numerals 123, 124 and 140 denote resistors and reference numeral 130 denotes a free-wheel diode.

The excitation circuit 102 permits controlling the charging of the capacitor 106 of the first circuit at a first rate during a first period of time and at a second rate during a second period of time, the second rate being higher than the first rate.

In contrast to the previously described related art in which the voltage at the terminals of the capacitor 106 of this first circuit is taken directly from the terminals of this capacitor, in the embodiment according to the present invention this voltage is taken from the terminals of a capacitor 111 of a second circuit comprising in series at least this capacitor 111 and an impedance 112 comprising for example a resistor and/or an inductor operating as a function of the operating frequency. This second circuit is connected through a diode 113 to the terminals of the second secondary winding 114 of the transformer 104. This second circuit is equivalent form an electrical point of view to the first circuit so that the voltage at the terminals of the capacitor 111 of the second circuit is the image of that at the terminals of the capacitor 106 of the first circuit.

Indeed, as the load of the transformer is essentially capacitive, the output voltage of the first winding of this transformer is at each instant equal to the charging voltage of the capacitor of the first circuit. In the case where the second circuit is equivalent from an electrical point of view to the first circuit, the voltage at the terminals of the capacitor of this second circuit is therefore the image of the voltage at the terminals of the capacitor of the first circuit so that it is possible to employ indirect means for obtaining the voltage at the terminals of the capacitor of the first circuit while achieving a galvanic insulation of these two parts of the generator.

The output of the comparing means 110 is employed, in a similar manner to that of the related art described previously for controlling the shorting means 109, for example through a transistor 115, and can also be employed for controlling the excitation circuit 102 of the source of energy feeding the primary winding of the transformer for determining the frequency of sparks in that, as the charge of the capacitor 111 is known, it is possible to obtain a time base permitting the determination of the frequency of the sparks.

Indeed, the capacitor 111 must be discharged after each spark and means for discharging this capacitor are provided at the terminals of the latter. These means may for example consist of a transistor of known type or a resistor 116. The discharging of the capacitor 111 into the resistor 116 permits obtaining the aforementioned time base and the value of this resistor may be so chosen to obtain a given spark frequency.

The general operation of this device is similar to that of the previously described related art and therefore need not be described in more detail.

What is claimed is:

1. High energy ignition generator comprising:
   a source of energy including a transformer having a first secondary winding and a second secondary winding,
   a first circuit connected to said first secondary winding and comprising in a series a first energy storage capacitor, an inductor and an ignition spark plug, and a free wheel diode connected in parallel to terminals of said inductor and said ignition spark plug,
   means for shorting said first circuit so as to produce sparks between electrodes of said spark plug, said shorting means comprising at least semi-conductor switching means for switching to short circuit said first circuit and means for controlling said switching means,
   means interposed between said source of energy and said first circuit for controlling the charging of said capacitor at a first rate during a first period of time and at a second rate during a second period of time, said second rate being higher than said first rate, and
   a second circuit comprising in series at least a second energy storage capacitor and impedance means connected to terminals of said second secondary winding of said transformer, said second circuit being electrically equivalent to said first circuit so that a voltage at terminals of said second energy storage capacitor is the image of a voltage at terminals of said first energy storage capacitor of said first circuit,
   said means for controlling said switching means including comparing means for comparing the voltage at terminals of said second energy storage capacitor with a reference voltage and means for controlling a switching of said switching means according to an output of said comparing means.

2. Generator according to claim 1, wherein said impedance means comprise an inductor.

3. Generator according to claim 1, wherein said impedance means comprise a resistor.

4. Generator according to claim 1, wherein said impedance means comprise an inductor and a resistor.

5. Generator according to claim 1, comprising means connected to the terminals of said second capacitor for discharging said second capacitor.

6. Generator according to claim 5, wherein said means for discharging said second capacitor comprise a resistor.

7. Generator according to claim 6, wherein said source of energy includes an excitation circuit operatively coupled to a primary winding of said transformer and wherein said comparing means are connected to said excitation circuit for controlling the frequency of said sparks in accordance with the value of said resistor for discharging said second capacitor.

* * * * *